United States Patent [19]

Schubert et al.

[11] Patent Number: 4,885,618

[45] Date of Patent: Dec. 5, 1989

[54] INSULATED GATE FET HAVING A BURIED INSULATING BARRIER

[75] Inventors: Peter J. Schubert, Greentown, Ind.; Robert J. Wallace, Southfield, Mich.

[73] Assignee: General Motors Corporation, Detroit, Mich.

[21] Appl. No.: 89,485

[22] Filed: Aug. 25, 1987

Related U.S. Application Data

[63] Continuation of Ser. No. 843,285, Mar. 24, 1986, abandoned.

[51] Int. Cl.$^4$ ............................................ H01L 29/78
[52] U.S. Cl. .............................. 357/23.11; 357/23.3; 357/23.4; 357/23.7; 357/23.8; 357/23.12
[58] Field of Search .................... 357/23.3, 23.4, 23.7, 357/23.8, 23.11, 23.12

[56] References Cited

U.S. PATENT DOCUMENTS 4,523,213  6/1985  Konaka et al. ..................... 357/23.7
4,571,606  2/1986  Benjamin et al. .................. 357/23.4

Primary Examiner—Edward J. Wojciechowicz
Attorney, Agent, or Firm—Domenica N. S. Hartman

[57] ABSTRACT

A metal-oxide semiconductor field-effect transistor (MOSFET) device having an insulating barrier buried in the substrate between the device's source and drain regions. The insulating barrier can be in contact with the source region of the MOS device. The barrier is implanted in the substrate through a masked implantation of high doses of oxygen, followed by an annealing of the oxygen to form the silicon dioxide insulating barrier. The insulating barrier can be either discrete or part of a continuous sheet of silicon dioxide placed below the silicon substrate. Placing the insulating barrier between the source and drain regions substantially diminishes the punch-through effect of subsurface currents, thereby increasing the punch-through voltage. This permits the construction of MOS devices having shorter channel lengths with resulting higher circuit density and greater speed.

2 Claims, 4 Drawing Sheets

INSULATED GATE FET HAVING A BURIED INSULATING BARRIER

This is a continuation of application Serial No. 843,285 filed on Mar. 24, 1986, now abandoned.

FIELD OF THE INVENTION

This invention relates to the structure of an MOS device and, more particularly, to a short channel MOSFET device having a buried insulator placed between its source and drain regions, for the purpose of increasing the punch-through voltage.

BACKGROUND OF THE INVENTION

The prior art shows that a field effect transistor (FET) can be built to control current passing between its source and drain regions by means of an electric field which results from the imposition of a voltage on the transistor gate. Such transistors are finding widespread use, especially in integrated circuits.

An insulated gate FET (IGFET) is typically created by implanting source and drain regions in a substrate material, the substrate being of one conductivity type and the source and drain regions being of another conductivity type. The electric fields in the channel, which is situated between the source and between the source and drain regions, result from the superposition of two separate electric fields. One electric field is due to the voltage applied between the gate and the substrate and is directed primarily perpendicularly to the substrate surface. This field gives rise to the channel at the substrate surface. The second electric field is created by a voltage potential between the drain and source regions. The second field causes charge carriers to flow from the source to the drain along the channel. The resulting electric field, which affects the performance of an IGFET, also depends upon the material conductivity types chosen and any doping of the channel region by impurities. One of the most popular IGFET configurations (the npn metal-oxide semiconductor FET, or MOSFET) is made by implanting n+- type source and drain regions in a p+- type substrate and using an oxide, such as silicon dioxide, as the gate insulator. In operation, the drain region of this configuration is held at a positive voltage with respect to its source region. This drain-to-source voltage creates depletion regions surrounding the source and drain regions, with the depletion region around the drain being somewhat larger.

In the absence of any channel doping, npn MOSFETS are "normally off" devices. That is, npn MOSFETS do not conduct a current until a sufficiently positive voltage (depending upon the materials used) is imposed between the gate and the source region. When the gate voltage exceeds this device-dependent threshold voltage, current begins to flow between the device's source and drain.

In today's electronic technology, where it is desirable to realize an increasing number of functions on an integrated circuit, increased transistor density is desirable. One manner of increasing transistor density is to decrease the physical size of each individual MOSFET. This size diminishment includes a shortening of the channel length, i.e., the separation between source and drain regions. Shortening the MOSFET channel length increases the electric field strength within the channel resulting from the drain-to-source voltage. This increased field strength has its disadvantages.

One major disadvantage of the short channel MOSFET is that high electric fields caused by the drain-to-source voltage imposed across the short channel can create a current flowing in the substrate below the MOSFET channel region. The drain-to-source voltage level at which this current is established is termed the "punch-through" voltage. Because the punch-through effect limits the peak operating voltage of the device (i.e., the voltage imposed between the source and drain regions), it is desirable to render the device as resistant to the occurrence of punch-through current as possible or, stated another way, to design the device so that punch-through current occurs only at a voltage which is well above the drain-to-source voltages at which the device will be operated.

The most commonly used methods for increasing the punch-through voltage are to increase the impurity concentration in the substrate and to increase the channel length. Increased impurity concentration results in lower carrier mobilities, adversely affecting the MOSFET's switching speed. A longer channel increases the area covered by each individual MOSFET and also adversely affects MOSFET switching speed.

One approach to increase the punch-through voltage is to place an insulating barrier in the substrate material where it will reduce the strength of the subsurface electric fields. As disclosed in Konaka et al., U.S. Pat. No. 4,523,213, some increase in the punch-through voltage can be obtained by placing this insulating barrier below the plane connecting the lower surfaces of the implanted source and drain regions. This placement, however, will not prevent a current from being generated in the channel region above the plane connecting the lower surfaces of the source and drain regions. It is desirable, therefore, to have a MOSFET structure which increases the punch-through voltage beyond the levels possible with the structures known to the prior art.

SUMMARY OF THE INVENTION

According to the present invention, a MOSFET device is provided which exhibits a higher punch-through voltage than those known in the prior art, thereby allowing device size reduction and higher density circuits.

In general, this is accomplished by a MOSFET device built by using a substrate material of a first conductivity type. The MOSFET device has a source region of a second conductivity type formed in the substrate, a drain region of the second conductivity type formed in the substrate and spaced apart from the source region to define a channel region between the source and drain regions. The channel region has at least two opposing sides, with an electronic gate next to the channel region (able to affect the electric field in the channel region) and an insulating barrier in the substrate, formed at least partly within the channel region on the side opposite the electronic gate structure. Further refinements of this embodiment are created when the insulating region is disposed toward the source region and, in particular, in actual contact with the source region.

In a second embodiment, the invention is an insulated gate MOSFET device utilizing a substrate of a first conductivity type, the substrate having a surface. A source region of a second conductivity type is formed in the substrate, as is a separate drain region of the second conductivity type formed in the substrate, both regions communicating with the substrate surface. The source and drain regions define a channel region having two opposing sides, one of the sides being closer to the substrate surface than the other. The second embodiment also includes an electronic gate which is an electrode placed on an insulating layer on the substrate surface over the channel region, and an insulating barrier in the substrate abutting the channel region on its opposing side away from the substrate surface. In the preferred form, the insulating barrier contacts the source region.

DETAILED DESCRIPTIONS OF THE PREFERRED EMBODIMENTS

Figure 1:
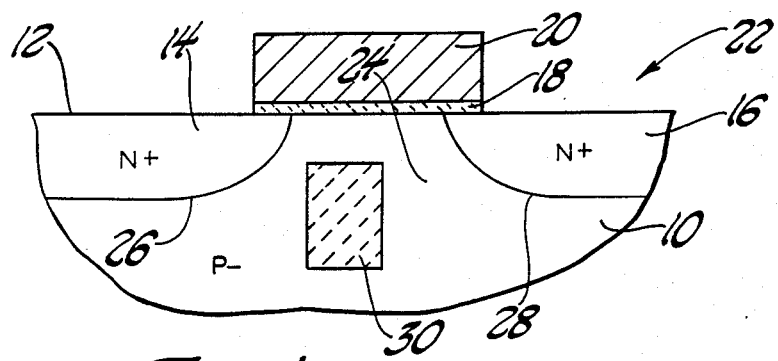
FIG. 1 shows a cross-sectional view of the structure of an enhancement mode npn MOSFET according to one embodiment of this invention.

With reference to FIG. 1 of the drawings, the structure of an enhancement mode npn MOSFET with a buried insulating barrier comprises a silicon substrate 10, substrate 10 being a very low conductivity p − substrate, eg boron doped silicon. The substrate has a surface 12, an n + source region 14, an n + drain region 16, an insulating layer 18, made from an insulating material such as silicon dioxide, and an electrode material 20, forming a gate for MOSFET 22. The channel region 24, between source 14 and drain 16, is affected by electric fields produced when a voltage is applied to electrode 20. Imposing a voltage drop between source region 14 and drain region 16 creates an asymmetric work function as a function of position within channel 24. In the absence of a positive voltage between the gate and source, a voltage potential exists at the interface between the source and the channel. This voltage potential largely prevents current from flowing through the channel, unless a punch-through condition exists, in which case carrier injection into the channel causes a current to flow.

Upon the imposition of voltage between the gate and substrate to produce an adequately high electric field in the channel, current (in the form of electrons, for these materials) begins to flow from source 14 to drain 16. This current is located close to surface 12 (generally within 0.005 um) but between source region 14 and drain region 16.

In addition to the features mentioned above, this embodiment of the invention further comprises a buried implanted barrier of electrically insulating material between the source and drain regions, 26 and 28, respectively. The insulating barrier 30 is placed so that it significantly suppresses the creation of punch-through current from source 26 to drain 28, as will be discussed below. Insulating barrier 30 can take any of a variety of forms, ranging from isolated blocks of insulating material to projections of insulating material standing away from a sheet of insulating material underlying an entire circuit.

The primary current path between source and drain regions, 26 and 28, respectively, is close to surface 12 in channel 24 under gate 20. However, currents are created when the voltage imposed between the drain and source regions exceeds the punch-through voltage. These currents appear within the bulk of substrate material 10 between the source and drain regions 26 and 28, respectively. The presence of insulating barrier 30 in the region between source and drain regions 26 and 28, respectively, substantially increases the drain-to-source voltage required to cause a punch-through current. Upon reaching the punch-through level, the drain-to-source voltage induces electric fields having sufficient magnitude to overcome the interior work function created by the back-to-back pn junctions of the drain-gate and source-gate interfaces, 26 and 28 respectively. This condition can be thought of as the meeting of the space charge regions which form around the source and drain regions, allowing the transfer of injected carriers.

Figure 2:
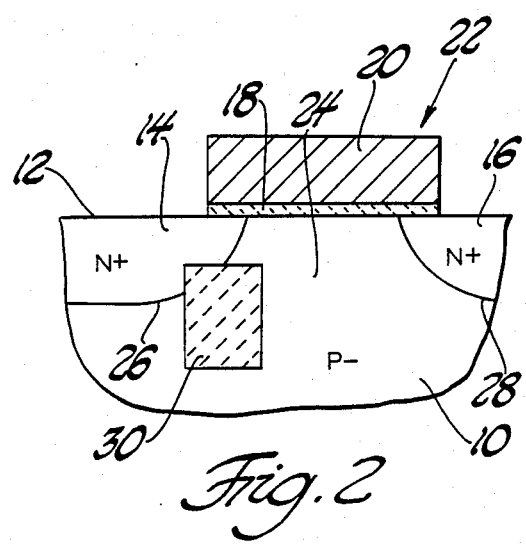
FIG. 2 shows a cross-sectional view of second embodiment of this invention.

FIG. 2 of the drawings is a cross sectional view of an alternative embodiment of the npn MOSFET of FIG. 1. Features which serve the same purposes as those features in FIG. 1 are designated by like numbers. In FIG. 2 insulating barrier 30 has been placed in contact with source region 26. Computer simulations have shown that configurations in which the insulating barrier 30 is in contact with the source region 26 exhibit especially high punch-through voltages, and are therefore especially advantageous. The insulating barrier 30 acts to reduce the area of source region 26 from which parasitic currents can be produced without affecting the area from which gate-controlled currents emanate. There is great advantage in placing insulating barrier 30 adjacent the source because its depletion region is smaller, and hence, most easily affected, by a barrier of a given size than is the drain region.

Figure 3A:
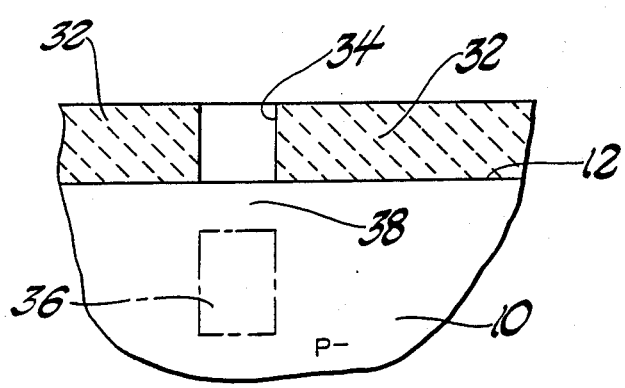
FIG. 3A - 3C illustrates cross-sectional views of the structural forms created in the intermediate steps of producing the MOSFET of FIG. 2.
Figure 3B:
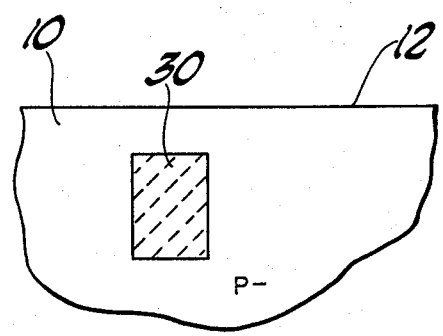
Figure 3C:
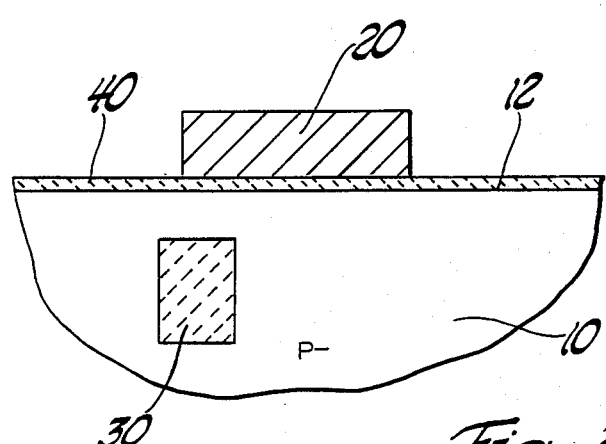

FIGS. 3A–3C of the drawings show intermediate steps in the formation of the npn MOSFET structure of FIG. 2. FIG. 3A shows substrate 10 with an overlaying patterned oxide coating 32 placed thereon. Implantation of very high doses (i.e., approximately $10^{18}/cm^2$) of oxygen are implanted into silicon substrate 10 through apertures 34 in oxide layer 32. The use of high implant energies, greater than 100keV implants the oxygen almost entirely below surface 12 of silicon substrate 10. This area of implanted oxygen 36 is then annealed to form stoichiometric silicon dioxide, and leaving a thin layer 38 of monocrystalline silicon above the buried silicon dioxide 36. This thin layer of monocrystalline silicon will form the channel for the MOSFET being constructed.

FIG. 3B shows the insulating silicon dioxide barrier 30 which results from annealing the implanted oxide barrier 36 from step 3A. The oxide layer 32 of FIG. 3A has been etched away from the surface of substrate 10, leaving an uncovered surface 12. In FIG. 3C, surface 12 of substrate 10 has been coated with a thin silicon dioxide layer 40 which will form gate oxide 18 of FIG. 2. Above gate oxide layer 40 is placed a pattern conducting polysilicon gate 20 which will later serve as the gate for the npn MOSFET being constructed. FIG. 3C shows the relative positions of polysilicon gate 20 and insulating silicon dioxide barrier 30 to construct the source abutting buried insulating barrier (SABIB) MOSFET of FIG. 2. The SABIB MOSFET of FIG. 2 is created from the structure of FIG. 3 by first implanting the source and drain regions 26 and 28, respectively (shown in FIG. 2) and etching gate oxide layer 40 from all areas except those which lie below polysilicon gate 20, although etching the gate oxide layer is frequently not done.

Figure 4A:
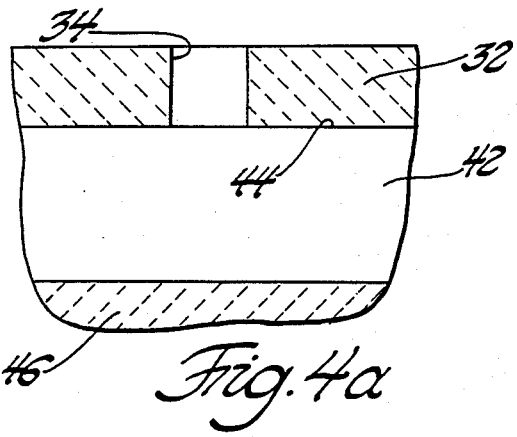
FIG. 4A - 4D sets forth cross-sectional views of the structural forms created in the intermediate steps of producing the enhancement mode npn MOSFET according to a third embodiment of this invention.
Figure 4B:
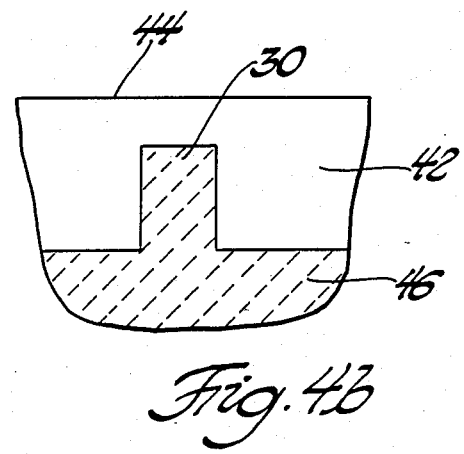
Figure 4C:
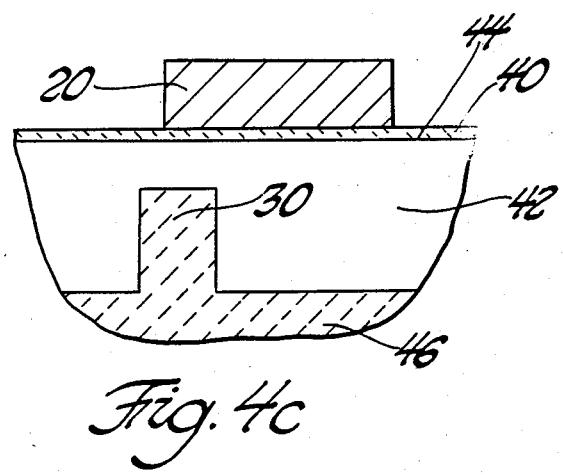

FIGS. 4A–4C show intermediate steps in the construction of a SABIB MOSFET having a silicon on insulator (SOI) structure. The result will be a SABIB MOSFET having a structure very similar to that shown in FIG. 2. In this process, the original material consists of a thin layer of monocrystalline silicon 22 having a surface 44, overlaying an oxide insulating layer 46. A thick patterned layer of oxide 32 (similar to that shown in FIG. 3a) is placed on surface 44 of silicon layer 42. By means of the oxygen implant process and subsequent annealing described in connection with FIG. 3A, a patterned insulating oxide layer comprising original layer 46 and formed oxide barrier 30 is placed under silicon substrate 42, as shown in FIG. 4B. A subsequent processing step shown in FIG. 4C is identical to that shown and described in connection with FIG. 3C.

Figure 4D:
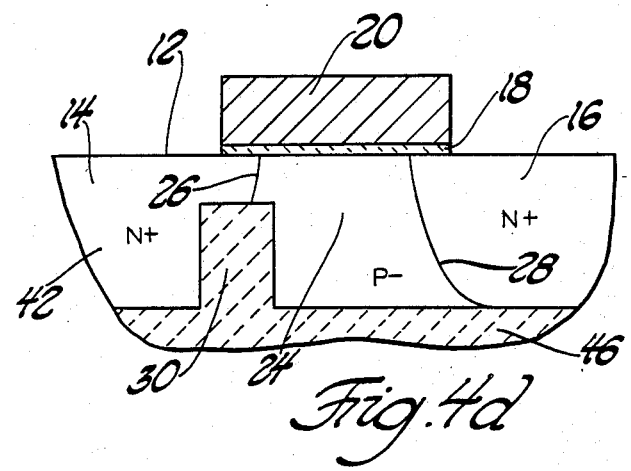

The SABIB MOSFET resulting from these steps and shown in FIG. 4D is identical to that shown in FIG. 2, except that the lower portion of insulating barrier 30 is contiguous with the underlying insulating oxide layer 46 of the SOI material.

Figure 5A:
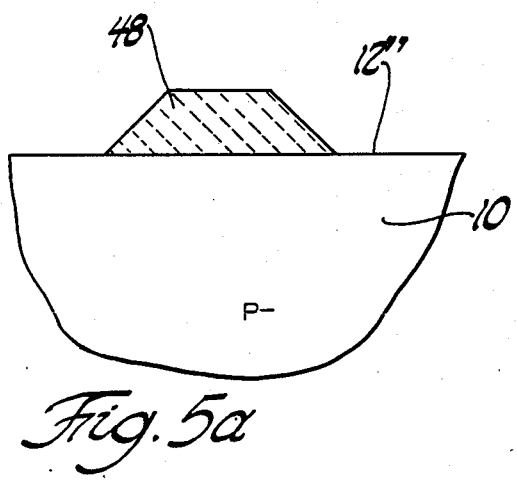
FIG. 5A - 5L indicates the cross-sectional structure of intermediate forms of an enhancement mode npn MOSFET produced according to a fourth embodiment of the present invention.
Figure 5B:

FIGS. 5A–5L describe yet another process for making a SABIB MOSFET. As shown in FIG. 5A, a silicon substrate 10 having a surface 12" is overlain by a thin patterned implantation mask 48 made from silicon dioxide. The implantation mask has a roughly trapezoidal cross section. By means of the oxygen implantation described in connection with FIGS. 3A and 4A, followed by an annealing of the implanted oxygen, a barrier layer of silicon dioxide 50 is created within silicon substrate 10. This is illustrated in FIG. 5B, after the silicon dioxide implantation mask 48 has been etched from surface 12" of substrate 10. The implanted and annealed silicon dioxide barrier 50 has a pattern which results directly from the varying implantation depths due to the variable thickness of implantation mask 48.

Figure 5C:
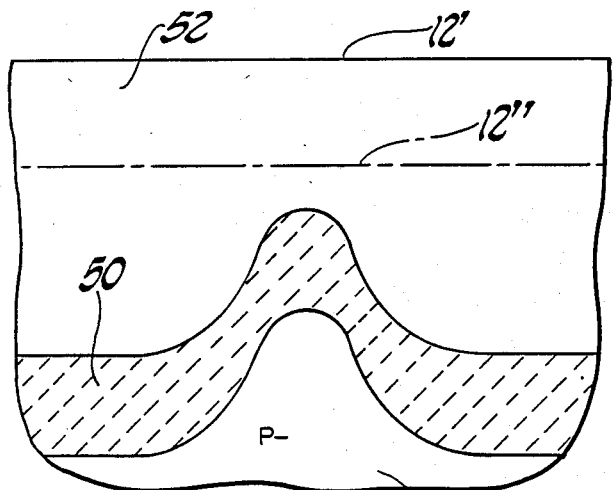

As shown in FIG. 5C, an additional thickness of epitaxial silicon 52 is grown over surface 12" of substrate 10 to place the patterned features of silicon dioxide barrier 50 an appropriate distance below new surface 12'. This new silicon layer is comprised of the combination of layers 10 and 52.

Figure 5D:
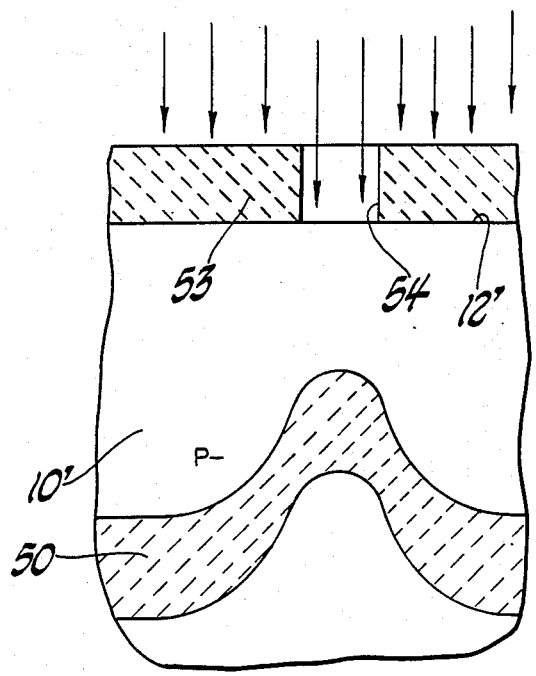
Figure 5E:
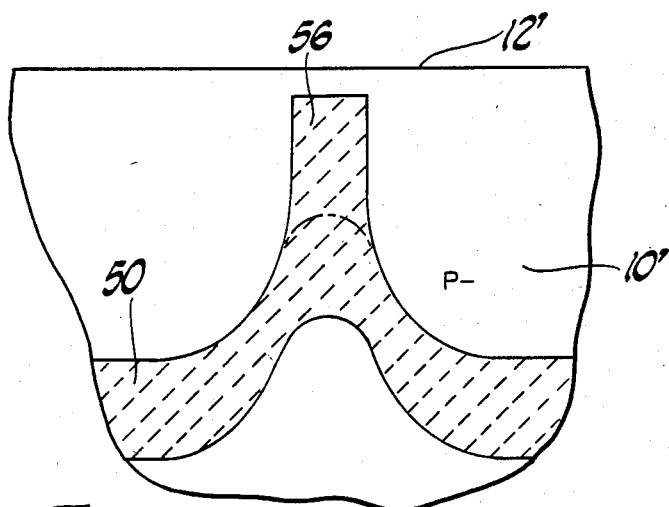

The next step in the process is the further development of oxide layer 50 through further implantation and annealing of oxygen. As shown in FIG. 5D, a thick patterned silicon layer 53 is placed on surface 12' of silicon substrate 10' (resulting from silicon substrate 10 and epitaxial silicon layer 52). Openings 54 in pattern 53 are placed above those areas here silicon dioxide barrier 50 most closely approaches surface 12' of substrate layer 10'. Through the oxygen implant and annealing process described earlier, silicon dioxide barrier 50 can be increased to produce a structure shown in FIG. 5E where barrier 50 has been increased by the addition of insulating structure 56. In FIG. 5E, thick oxide insulating layer 52 has been etched away from surface 12' of substrate 10'.

Figure 5F:
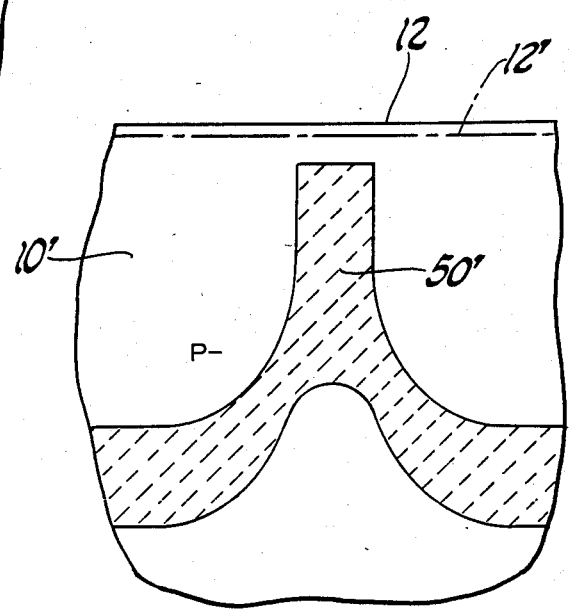

Additional epitaxial silicon is deposited on surface 12' of substrate 10', further increasing the distance from the top of silicon dioxide insulating barrier 50' to new silicon surface 12, as shown in FIG. 5F.

Figure 5G:
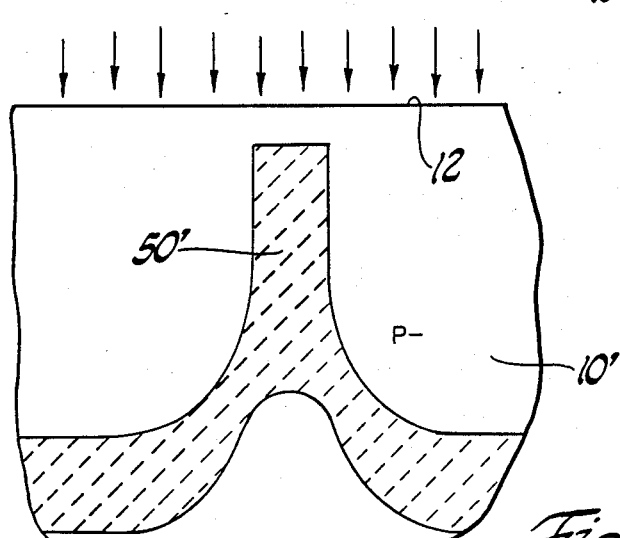
Figure 5H:
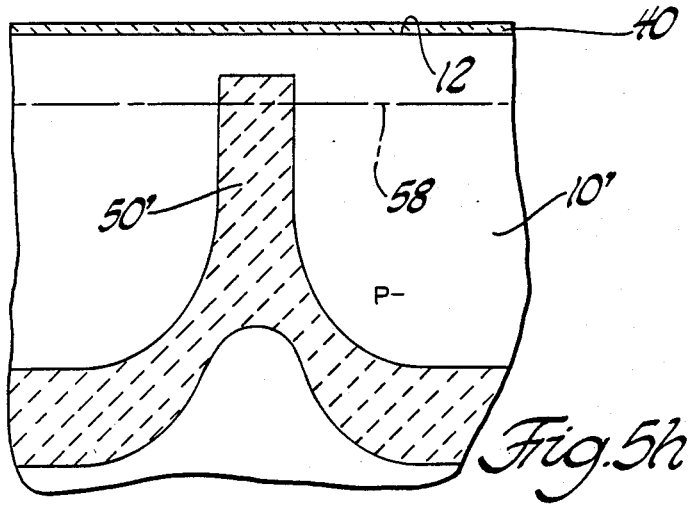

The structure resulting from FIG. 5F can be subjected to a channel implant, as shown in FIG. 5G. This implant is used for threshold voltage control and serves to lessen the encroachment of the depletion region near the silicon surface by increasing the impurity concentration there. FIG. 5H shows the depth of the channel implant, denoted by 58, and the placement of a thin gate oxide layer 40 over surface 12.

Figure 5I:
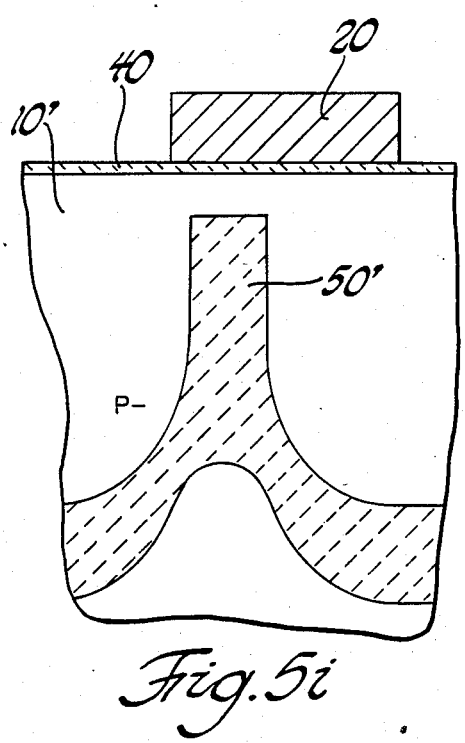
Figure 5J:
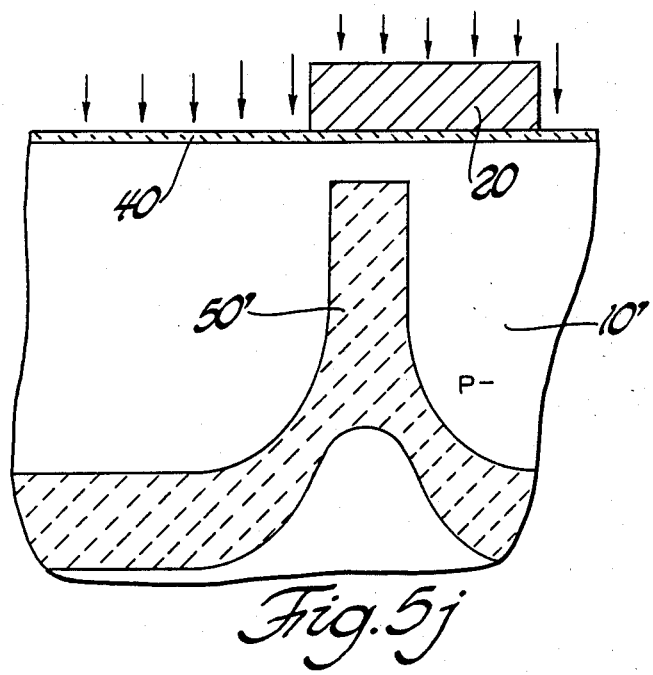
Figure 5K:
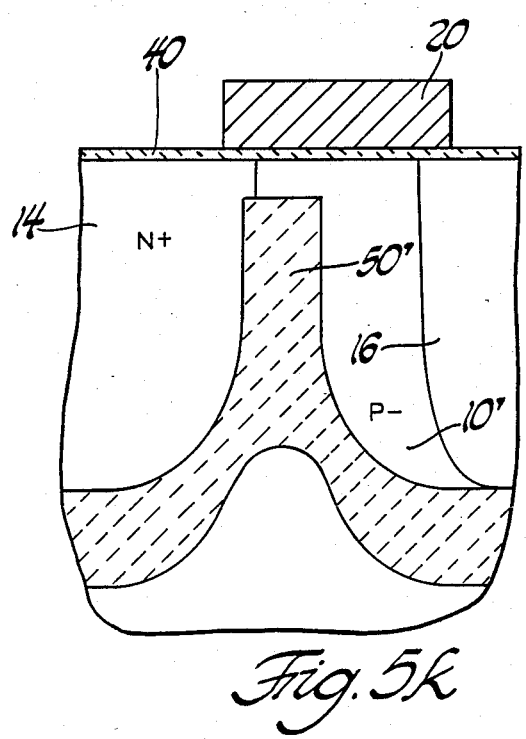
Figure 5L:
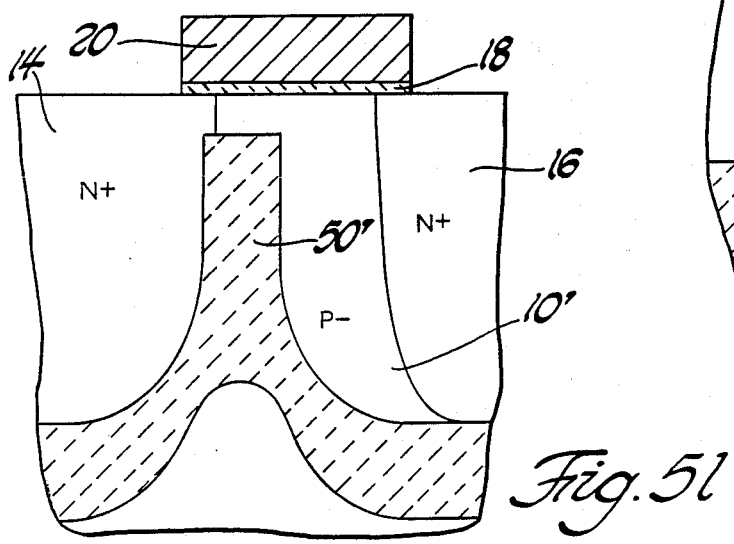

In FIG. 5I, polysilicon gate 20 is placed over thin oxide layer 40 at an appropriate position relative to barrier 50'. Implantation of the source and drain regions as shown in FIG. 5J, produces the structure shown in FIG. 5K, where source and drain regions 14 and 16, respectively, are created relative to polysilicon gate 20 and barrier 50'. Etching away thin oxide layer 40 except where it underlies polysilicon gate 20 produces the structure shown in FIG. 5L. This structure is directly analogous to the SABIB MOSFET shown in FIG. 2 with the exception that insulating barrier 50' extends under the full surface of substrate 10'.

MOSFETs produced in accordance with the procedures outlined in the preceding detailed descriptions, as well as modifications which will be obvious to those skilled in the art, will have shorter channel lengths and therefore increased circuit density and greater switching speeds.

Although the above detailed descriptions have been placed in the context of the construction of an enhancement mode npn MOSFET having a buried insulating barrier, it will be understood by those skilled in the art that a variety of alternative materials of different conductivity types may be used. For instance, the gate may possibly be insulated from the substrate surface by a layer of electrically insulating material other than an oxide: in this case, the resulting device may more properly be termed an IGFET while remaining within the scope of this invention. Further, it will be understood that appropriate intermediate doping steps can be used to construct MOSFETs having alternative performance. Examples are the creation of depletion mode and pnp MOSFETs. Accordingly, the spirit and scope of the present invention is to be limited only by the following claims.

We claim:

1. An insulated gate field effect transistor device having means for significantly increasing punch-through voltage, comprising:
    a substrate of a first conductivity type;
    a source region of a second conductivity type formed in the substrate;
    a drain region of the second conductivity type formed in the substrate in spaced relation with the source region to define a channel region of predetermined thickness between the source and drain regions, the thickness of the channel region being between the substrate surface and the innermost plane within the substrate which is able to intersect the source and drain regions, said innermost plane is disposed in a direction extending from and generally parallel to said substrate surface;
    a gate dielectric and gate electrode structure on the substrate surface, operable to produce an electric field in the channel region when a voltage is applied thereto; and
    an insulating barrier buried in the substrate, said insulating barrier being substantially planar and disposed perpendicularly to said substrate surface, and having at least a portion extending into at least the majority of the channel thickness toward said substrate surface from below said innermost plane within said substrate, but not intersecting said substrate surface.

2. The MOSFET device of claim 1, wherein said portion of the insulating barrier is in contact with the source region but not the drain region.

* * * * *